United States Patent

Johnson

(10) Patent No.: US 7,308,394 B2
(45) Date of Patent: Dec. 11, 2007

(54) METHOD FOR MODELING AND TESTING A SECURITY SYSTEM

(75) Inventor: Dennis J. Johnson, Salem, NH (US)

(73) Assignee: Ultravision Security Systems, Inc., North Salem, NH (US)

( * ) Notice: Subject to any disclaimer, the term of this patent is extended or adjusted under 35 U.S.C. 154(b) by 101 days.

(21) Appl. No.: 11/112,437

(22) Filed: Apr. 22, 2005

(65) Prior Publication Data

US 2006/0190228 A1    Aug. 24, 2006

Related U.S. Application Data

(60) Provisional application No. 60/656,428, filed on Feb. 24, 2005.

(51) Int. Cl.
G06G 7/62 (2006.01)
G06F 17/50 (2006.01)
G06F 9/44 (2006.01)
G06F 13/12 (2006.01)

(52) U.S. Cl. .......................................... 703/13; 703/21

(58) Field of Classification Search .................. 703/13, 703/21, 22
See application file for complete search history.

(56) References Cited

U.S. PATENT DOCUMENTS 6,052,524 A    4/2000  Pauna .......................... 703/22
7,158,022 B2 *  1/2007  Fallon ......................... 340/506

OTHER PUBLICATIONS

Agah et al., Intrusion detection in sensor networks: A non-cooperative game approach, Aug. 2004, 3rd IEEE International Symposium on Network Computing and Applications, NCA 2004, Boston, MA, pp. 343-346.*

* cited by examiner

*Primary Examiner*—Paul Rodriguez
*Assistant Examiner*—Juan Carlos Ochoa
(74) *Attorney, Agent, or Firm*—Madan, Mossman & Sriram, P.C.

(57) ABSTRACT

A method of designing, modeling and testing a security system for protecting a defined security area. The method includes modeling the security area, modeling the security system for the security area, and testing the security system using a computer to run various breach scenarios to determine weaknesses in the security system. The testing may be in the form of a computer game with one or more players implementing the models and scenarios or in real-time.

19 Claims, 3 Drawing Sheets

METHOD FOR MODELING AND TESTING A SECURITY SYSTEM

CROSS-REFERENCE TO RELATED APPLICATIONS

This application relates to, and claims priority from, U.S. Provisional Patent Application No. 60/656,428 titled Method for Modeling and Testing a Security System filed on Feb. 24, 2005, the entire contents of which are hereby incorporated herein by reference.

BACKGROUND OF THE INVENTION

1. Field of the Invention

This invention generally relates to security systems for a structure and the area surrounding the structure. More particularly, this invention relates to a method of designing a complex security system that enables determining the efficacy of the security system in real-word scenarios prior to implementation of the actual system components and enables efficient personnel training.

2. Description of the Related Art

A multitude of instances exist wherein it is desirable to implement a security system for a given area. Such an area, or security area, may be of any size and may include structures, facilities supporting the structures, infrastructures, grounds within a defined perimeter, and outer perimeter grounds and structures. The security area may be a single family dwelling, a multiple family dwelling, a business facility, a government or military installation, or a natural area such as a park or preserve. In some cases, a security system is designed along with the security area. In other cases, security systems are implemented in existing structures and areas.

Security systems today may include sophisticated sensor technology, monitoring systems, command and control systems and security personnel. It is quite obvious that even smaller systems can become expensive to implement, and once implemented, gaps in the security system can be costly in terms of property loss and/or personal injury or loss of life.

Typically, new or retro-fit systems are designed by receiving customer requirements with specifications of the security area. The security system designer uses the customer requirements, specifications and allocated budget to select system elements and methods to secure the area. Once accepted, the system is physically implemented and tested. The system tests typically consist of physical testing of the system elements, i.e. providing a known input to test for an expected output within element specifications.

In rare cases, the overall security system is tested using mock drills once the system is installed and operational. In some cases, existing systems are tested by these mock drills, but these drills can be labor intensive, will disrupt normal work hours and schedules of the facility, and may fail to account for certain scenarios of breach. Therefore, there is a need to reduce labor and facility/workforce time required to test security systems and to train personnel on installed security systems.

Sometimes rework is required due to specification changes, unforeseen obstacles, or testing results revealing one or more selected elements do not meet customer requirements. These rework operations can become quite costly and cause delay in system completion. Therefore, there is a need to reduce rework of security system elements by optimizing the security system prior to installation.

Electrical circuit modeling is known as exemplified by U.S. Pat. No. 6,052,524 to Pauna for "System and method for simulation of integrated hardware and software components." The '524 patent describes a system and method for simulation of integrated hardware and software components. The described system includes a cycle-accurate simulator where X-number of simulator cycles is equivalent to Y-number of cycles on a simulated hardware component. The cycle-accurate simulator models stages of an operation execution pipeline for a desired hardware component (e.g., a central processing unit). The cycle-accurate simulator may indicate how long an operation takes to execute and may indicate the timing and sequence of operations as they occur. The cycle-accurate simulator is preferably event driven, and events are used to determine timing behavior and interactions of hardware and software components in a simulation. The cycle-accurate simulator also may be used in an "instruction timing" mode, where the number of cycles required for a general operation is determined, but the order or timing of individual operations that make up the general operation are not simulated.

The system described in the '524 patent further includes a simulator library for modeling and verifying hardware components of a desired electronic device. The simulator library may include built-in models for simulating multiple internal and external hardware components (e.g., central processing units, memory, memory management units, caches, timers, universal asynchronous receiver transmitters and digital signal processors). The built-in models return a number of cycles on the cycle-accurate simulator executed for a desired simulated operation. The simulator library may also include simulator interface routines for setting a clock for a simulated component to a new clock speed, coordinating between a simulator library clock and a cycle-accurate simulator clock, handling events that occur before or during a current clock cycle, changing interrupt vectors and interrupt priority levels, providing notification of changes in registers during a simulated operation, or for setting one or more individual sub-components (e.g., status bits) of a simulated hardware component. The simulator library with built-in models and routines is used as an interface to the cycle-accurate simulator.

Modeling techniques such as those described in the '524 patent are only applicable to a circuit-level system. In other words, the method is essentially an automated circuit and software analysis. These modeling techniques do not address real-world implementation and cannot be extended to designing and testing the functionality of a complete security system in real-world situations. There is no recognition of the problem with meeting all technical system requirements and then having an outside force intentionally attempting to defeat or otherwise breach the system.

There is a need for a system and method for designing a security system and testing the design and proposed system architecture prior to implementing the system. There is a need also for a system and method of testing existing security systems with reduced labor and enhanced coverage of a wide range of breach scenarios. The typical security system lacks efficient training capability. Therefore, there is a need for more efficient training in real-world scenarios while minimizing labor and work-hour disruptions.

SUMMARY OF THE INVENTION

The present invention addresses some or all of the drawbacks discussed above by providing a method of designing and testing a security system using several real-world breach scenarios to test selected sensors and countermeasures prior to installing the sensors and countermeasures.

One aspect of the present invention is a method of modeling and testing a security system comprising selecting one or more security elements of a security system for a predetermined security area, modeling the security area using the selected security elements placed in locations in the security area, selecting a breach scenario to test the modeled security system, and executing the breach scenario. Parameters may be added to the security system model and/or to the breach scenario to enhance realism. The parameters may include conditions such as time of day, environmental conditions, weather conditions and meteorological events. Conditions may include temperature, wind speed, precipitation, high water, vibration and any other realistic condition to enhance realism for the model.

The security elements may be selected sensors having known specifications. The elements may include any or all of i) an ultra wide-band (UWB) sensor, ii) a closed-circuit TV (CCTV), iii) a microwave sensor, iv) a laser sensor, v) a contact switch, vi) an infrared sensor, vii) a motion sensor, viii) a heat detector, ix) a smoke detector, x) a pressure sensor, xi) an accelerometer, and xii) a vibration sensor. The security elements may include security forces and/or personnel executing defined countermeasures and/or response procedures.

Another aspect of the invention is an implementation of the method in the form of a computer game. The method includes modeling a command and control center for the security system. The game includes a computer simulation, wherein a first player protects the security area using the security system model to respond to an attack from a second player implementing a breach scenario.

In response to a result of the game or of the test, the security system and/or security area may be updated based in part of a determined weakness.

In one aspect the testing or game is performed at least in part remotely using at least two computers connected by one of i) a LAN, ii) a WAN, iii) an intranet, and iv) an Internet. In the game, either one of the first player and the second player may be computer generated. Both players may be computer generated for a fully automated test of the security system. When using human players, each player may be multiple players collaborating to win the game.

In another aspect a computer-readable medium with instructions recorded thereon for modeling and testing a security system using a computer, the instructions comprising selecting one or more security elements of a security system for a predetermined security area, modeling the security area using the selected security elements placed in locations in the security area, selecting a breach scenario to test the modeled security system, and executing the breach scenario.

In another aspect, a method of training personnel using a computer modeled security system includes selecting a breach scenario for the modeled security system and responding to the breach scenario using a computer.

BRIEF DESCRIPTION OF THE DRAWINGS

For detailed understanding of the present invention, references should be made to the following detailed description of the preferred embodiment, taken in conjunction with the accompanying drawings, in which like elements have been given like numerals and wherein.

DESCRIPTION OF THE PREFERRED EMBODIMENT

Figure 1:
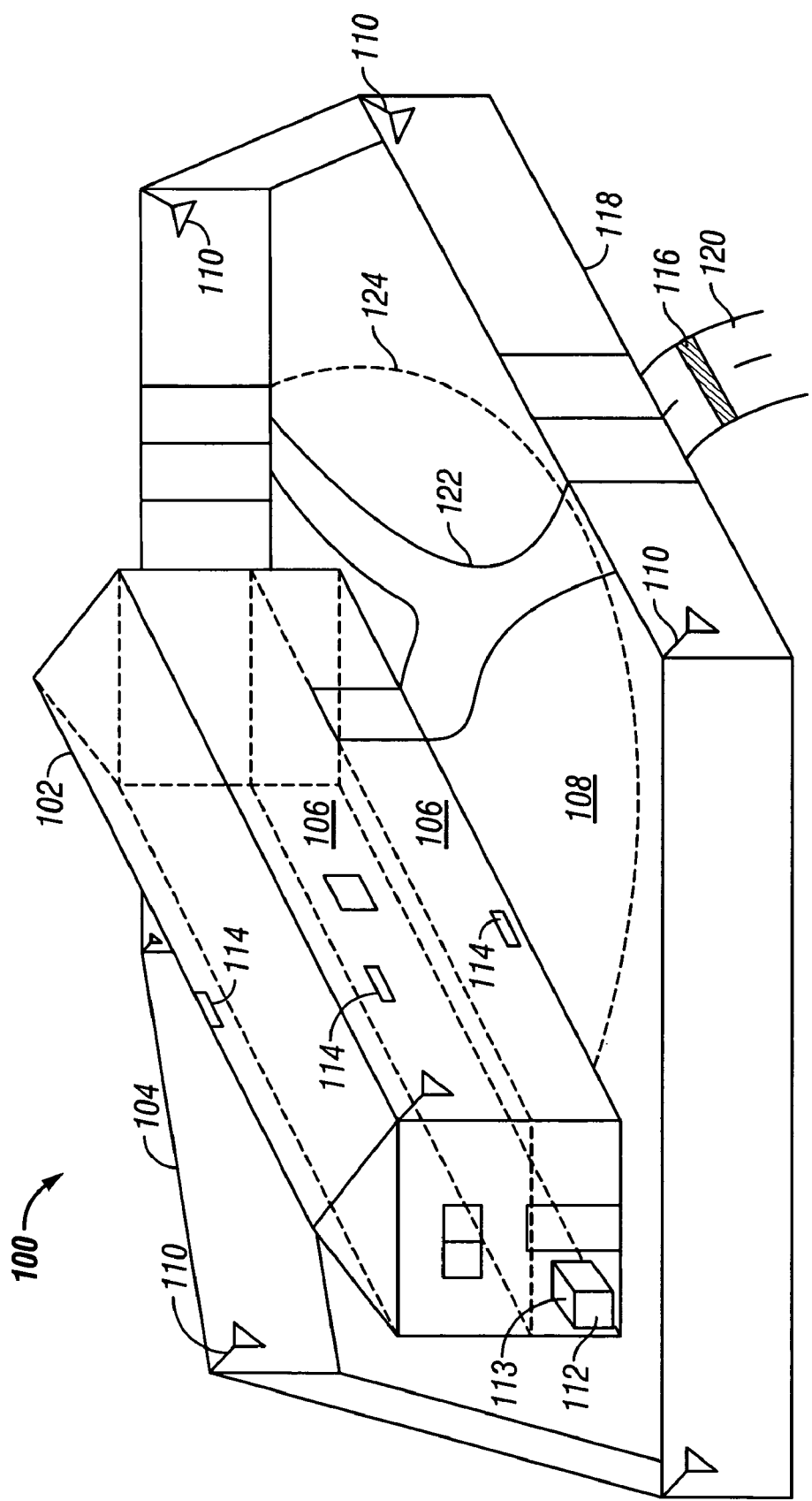
FIG. 1 is a wire-frame elevation view of a structure with surrounding perimeter and gated entry.

FIG. 1 is a wire-frame elevation view of a structure with surrounding perimeter and gated entry to illustrate a generic security area 100. The security area 100 includes a structure 102 with a defined perimeter 104. The security area includes the internal volume of the structure 102, the grounds within the perimeter 104 and the grounds surrounding the perimeter 104.

The structure 102 may include a plurality of structures. The perimeter 104 may be a wall or fence surrounding the structure(s) or the perimeter may be a defined boundary, which cannot be otherwise distinguished by viewing. The perimeter may also include several defined perimeters that may or may not be directly connected to one another. The perimeter may be the boundary of a wildlife refuge, a national or a state park, or the perimeter may be a zone around a military installation. Furthermore, instead of a man-made structure as shown, the structure 102 may be a natural structure, e.g. park caverns. Suffice it to say that the term "security area" as used herein means any area for which security is desired.

In one aspect of the invention, the structure 102 is a building as shown. The building may include multiple floors 106 and inner rooms, walls, floors, roofs, concrete parking structures, windows, doors, interior piping, furniture etc. . . . The security area 108 around the building may also include various facilities and grounds that support the security area. Some examples include fences 118, roads 120, sidewalks 122, underground pipes and sewers 124, topography, water features, trees, landscaping, etc. . . .

A security system for a security area as shown in FIG. 1 might include any number of security elements 110. Exemplary security elements may line-of-sight sensors, motion detectors, pressure sensors, monitors, ultra-wide band (UWB) sensors, contact sensors, lighting, smoke and heat detectors, biological material sensors, and personnel deployed throughout the security area. A command and control center 112 might be used to integrate and monitor all of the system elements. The system may also include telephone and/or computer access to the outside world for alerting officials of a security breach. The command and control center includes a computer 113. The computer 113 includes a processor, a storage system, an output monitor, printer and/or any other computer output device. The computer 113 further includes input devices such as a keyboard, mouse, joy stick, and/or any other desired computer input device suitable for implementing the present invention. The computer 113 may be portable, stand-alone or an integral component of a security system command and control console.

Structures in the security area may have several sensors 114 or other security elements in the event the outer perimeter is breached. The outer perimeter might also include various buried sensors 116 such as pressure sensors or other sensors for detecting vehicle and/or personnel movements.

Figure 2:
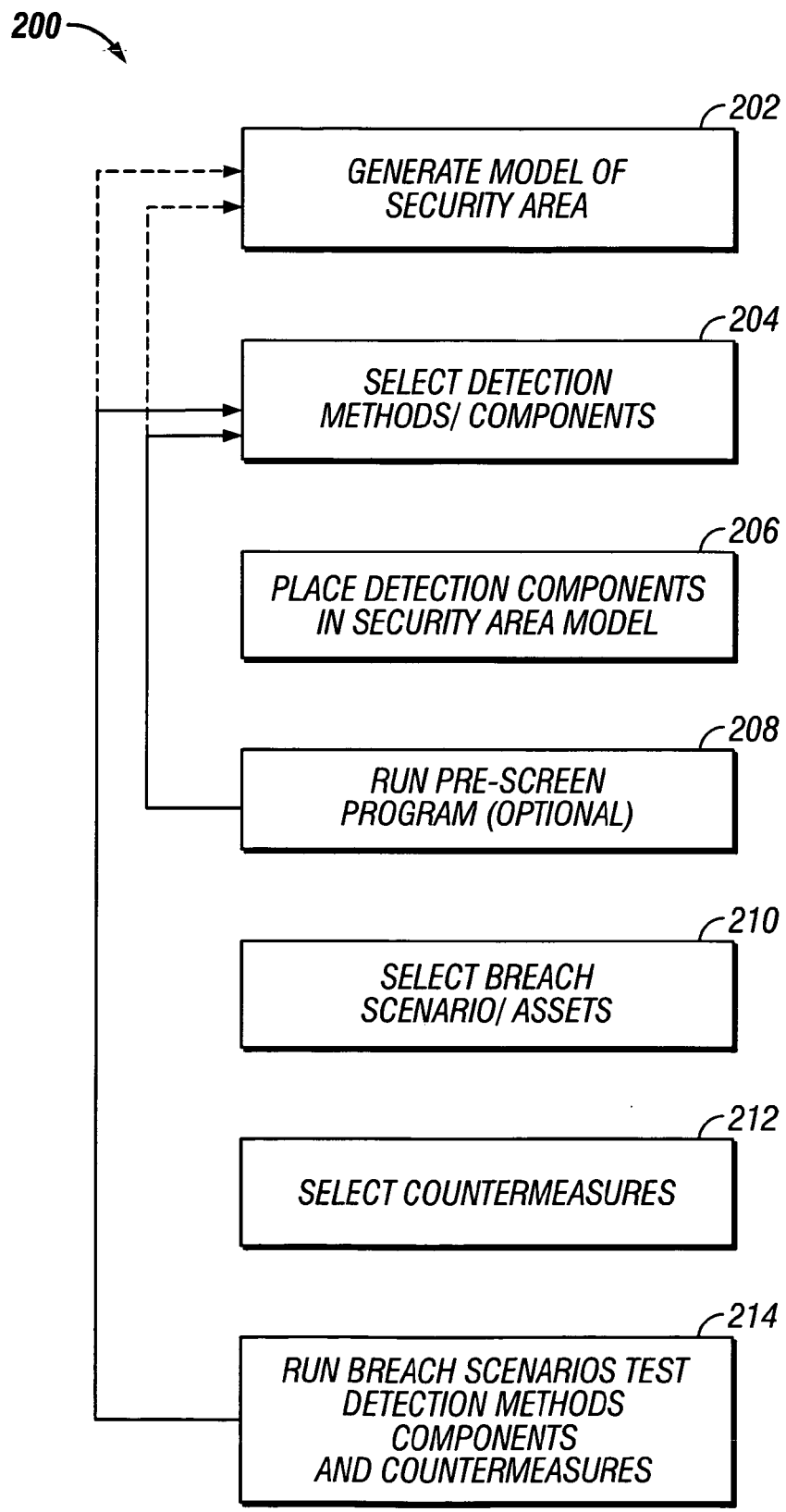
FIG. 2 is a flow of a method according to the present invention.

A method of modeling and testing a security system, such as the system 100, is depicted in the flow of FIG. 2. The method includes using a computer system programmed to process instructions stored on a computer-readable medium such as a hard drive, computer disk, tape, optical disk, flash memory, read-only memory (ROM), random-access memory (RAM), or flash memory.

The method 200 includes generating a security area model 202 of the security area 100. A designer then selects 204 detection methods and components, i.e. security elements. The selected security elements are then placed 206 in the security area model 202 to define a security system model. An optional pre-screen program may be executed 208 to test the selected security elements in the placed locations to determine whether blind spots exist. Various breach scenarios and assets are selected 210. Breach countermeasures are selected or added to the models 212. The breach scenarios are executed 214 to test the security area model 202. In this manner weaknesses in the design or security logic can be detected and corrected. Each element of the modeling and testing will now be described in more detail.

The security area model 202 may be any desired precision depending upon the security level desired in view of available budget. For example, the model of a residential structure might be much less sophisticated than the model of a military installation. The security area model may include the structure, grounds, perimeter and areas outside the perimeter. The security area model should include actual size and distance information relating to the structure, grounds and perimeter, because many sensors and camera lenses include specifications relating to distance.

The security area model may further include materials information, e.g. structure materials such as concrete, wood, metal etc. . . . This information is helpful in determining the proper sensor technology. For example, some sensors can penetrate some materials and not through other materials. If the structure is all metal, for example, one would typically not use an UWB sensor, since it will likely not penetrate the metal structure. However, a concrete, wood or metal frame structure might be a better application of a UWB sensor.

The security area model may also include floors and inner rooms, walls, floors, roofs, concrete parking structures, windows, doors, interior piping, and furniture for each structure in the security area. The security area model may also include various facilities and grounds such as fences, roads, sidewalks, trees, landscaping, underground pipes and sewers, topography, water features, etc. . . . In one embodiment, a database of materials, structures, plants, pipes and the like is used to build the model. Properties of these elements are updates as modeling of similar areas provides additional information.

In one implementation of the method, the modeling program provides a modeling tool box for drawing buildings, structures, walls, floors, roofs, concrete structures (e.g., parking garage), windows, doors, interior piping, furniture, and anything else desired for representing the structure 102.

Selecting security elements 204 for the model may be from a data base of known elements or the selected security element may be developed for a particular model. The security element may be any number of sensors. Exemplary sensor technology includes ultra wide-band (UWB), closed-circuit TV (CCTV), microwave sensors, laser sensors, contact switches for doors gates and windows, infrared sensors, motion sensors, heat and smoke detectors, pressure sensors, accelerometers and vibration sensors. In one aspect of the invention, the database supports a tool box identifying all available sensors in the database. New sensors developed or selected outside of the database may be added to the database and tool box for future modeling projects.

Sensor parameters and specifications are input to a database either before or during modeling. Sensors are selected based in part of the ability of the sensor to accommodate a specified portion of the security area as modeled 202. The selected sensors are placed 206 in the model 202 to define a security system model. A pre-screen program may be run 208 to identify blind spots in the security system model. A blind-spot is an area of low or no coverage when all of the selected sensors are on-line and operating according to the specifications. The security system model may then be updated by selection additional sensors, changing sensors or adjusting sensor sensitivity where such adjustments are within the selected sensor specifications. The pre-screen program utilizes the security element specifications from the database and the defined security area parameters and materials to calculate coverage for each security element. A blind spot may exist were a wall of a given material obscures the range of a particular selected security element. In some cases, security elements are simply placed too far apart such that the specified ranges do not overlap.

One or more breach scenarios are selected 210. A breach scenario is any potential risk to the security area. A breach may be a physical breach by one or more intruders. An intruder may be on foot or in a vehicle, which may be ground, water or flight. The breach scenario should be a realistic scenario. For example, using a human running on foot at an unrealistic speed may not be a valid test of the security system model. Furthermore, while any realistic scenario may be selected, one might not expect a civilian single family residence security area to be breached by an armored vehicle even if such a vehicle is available in the database for other models. As will be discussed later, the breach scenario may be developed by test personnel during testing, and the breach scenario may be developed by a collaborative effort of experts in the various sensor technology selected for the security area model. Breach scenarios as used herein includes the pre-screen program. Thus, running a pre-screen program is a type of breach scenario.

Other parameters may be used in either the breach scenario and/or in the security system model to promote realism in the testing. These parameters may be various environmental conditions internal to the structures and/or of the outside conditions of the security area. These conditions may be any number of conditions to promote realism. Without limitation, such conditions may be temperature, wind, precipitation, fog, vibration, high water, ice, vibration (natural or machine) or any other realistic condition useful in determining the effectiveness of the system or in the training of personnel in the use of a security system.

In one embodiment at least a portion of a breach scenario may be computer-generated based in part on the selection of security elements. In one aspect of the method the breach scenario may be selected using a tool box associated with the database including people, soldiers, vehicles and any object that may be moved within the facility to create a security threat.

Countermeasures are developed or selected 212 from a database either in anticipation of possible breach scenarios or after breach scenarios are selected 210. Countermeasures may include personnel response, alarms, and/or alerts to outside entities (e.g., fire, police, or security staff etc).

In one embodiment at least a portion of the countermeasures are computer generated and provided to the designer in the form of a computer output. The out may include mandatory procedures where certain breaches require certain response. The output may provide suggested countermeasures where selected scenarios have been successfully countered in past models or in past real-world cases. These countermeasures, mandatory and suggested, may be stored in a countermeasure database for ready access when desired. The database of countermeasures may be implemented as a tool box for easy selection. Newly developed countermeasures and procedures for specified breach scenarios may be added to the database and tool box for future modeling projects.

The breach scenarios are executed 214 either before or after the selection of countermeasures 212. The breach scenarios may be executed 214 without previously running the pre-screen program, because the result of running the breach scenario will include a determination of blind spots. A result of executing the breach scenario may be in the form a computer output to the designer. The output may point out weaknesses in the sensor selection, the architecture of the security system or even of the security area itself. The designer may use the output to determine if the overall security system design and implementation plan will meet customer requirements and/or goals. If not, then a change in the selection of security elements, or element parameters may be made and the method can be executed again to optimize the security system model. This optimization may be implemented as an iterative process.

The output may be used in effecting a design change to the security area structure, facilities or perimeter system when the method is being implemented in the design and construction phase of an installation. If this is the case, then the security area model 202 may be updated prior to implementing the design change and the method executed again to test the design change and updated security system.

Figure 3:
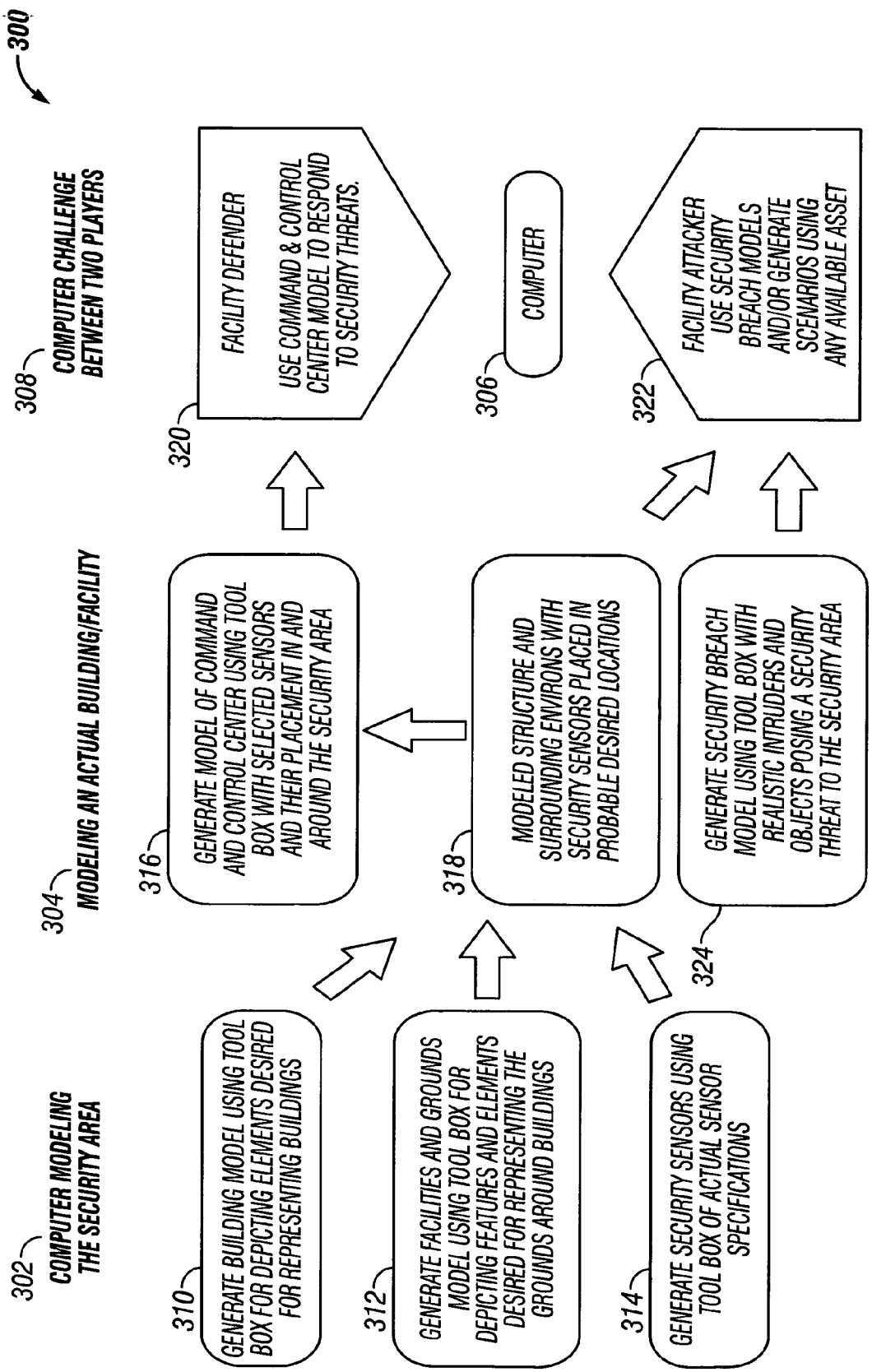
FIG. 3 is another flow of a method according to the present invention, wherein the testing according to the method is implemented as a computer game.

FIG. 3 is another aspect of the present invention wherein the security system modeling and testing is performed by one or more users in the form of a computer role-playing game. The implementation is shown as a flow 300. A security area modeling flow 302 is substantially similar to that described above and shown in FIG. 2. A flow may also be generated 304 for an actual or existing building/facility having a security system and command and control center. Outputs from the security area flow 302 and/or from the building/facility flow 304 are provided to a computer 306 implementing a program flow for a computer challenge 308.

A model of the security area is generated 302. Buildings and structures are modeled 310 using a tool box for depicting such elements. A facilities and grounds model is generated 312 using a tool box for depicting fences, roads, sidewalks, trees, landscaping, underground pipes and sewers, topography, water features and anything else desired for representing the grounds around buildings. Security elements are generated 314 using a tool box that includes actual sensor specifications. As described above, any known or developed sensor may be selected such as ultra wide-band (UWB), closed-circuit TV (CCTV), microwave sensors, laser sensors, contact switches for doors gates and windows, infrared sensors, motion sensors, heat and smoke detectors, pressure sensors, accelerometers and vibration sensors. The modeling of the security area flow may then be provided to the command and control flow 304.

Actual building integration is developed in the command and control flow 302. A structure and surrounding environs with security elements placed in probable desired locations is modeled 318 as described above in FIG. 2 for defining the security system.

A model of a command and control (C&C) center information and displays is generated 316 using a tool box including the various components, interface requirements and parameters. The C&C model is based on the prior selection of sensors and their placement in the facility from the model 318.

Intruder forces are modeled 324 using a tool box including people, soldiers, vehicles and any object that may be moved within the facility to create a security threat.

The C&C models and the Breach models are then used on a computer with one or more users in a role-playing style game for determining whether an intruder can breach or otherwise defeat the security system modeled.

Facility Defender 320—This Player sees the command & control center, alarms and viewers. The Defender must respond to any and all alarms with designated counter measures (Security Force.)

Facility Attacker 322—This Player attempts to enter the facility with any available asset from the breach model or may generate a breach scenario in real-time.

In one aspect the Facility Defender may use a computer-generated Attacker. A computer-generated attacker is an algorithm utilizing the security breach models to present a security threat to the facility. The program is implemented as an iterative process to test each aspect of the security system. In one aspect, simultaneous breach scenarios may be executed to determine whether the security system model can respond adequately to simultaneous attacks.

In one aspect, the Facility Defender may be a collaboration of several people. Likewise, the Facility Attacker may be a collaboration of several people. In one aspect, the test game is remotely implemented among players utilizing two or more computers linked using a local-area network (LAN), wide-area network (WAN), an intranet or the Internet. In some cases where complex security systems and facilities are being tested, various experts may join from remote locations. This may be the case when designing and/or testing military installations. These personnel may be expert in security systems or in the security elements used in the system, and therefore join on the side of the Facility Defender. Likewise, these personnel may be expert in military or assault tactics, and therefore join in on the side of the Facility Attacker.

In one embodiment, a method of training personnel using a computer modeled security system includes selecting a breach scenario for the modeled security system and responding to the breach scenario using a computer. The method can be implemented using either the flow described above and shown in FIG. 2 or using the role-playing game flow described above and shown in FIG. 3. This training method is a simulator method somewhat like the use of flight simulators for pilot training and proficiency tests. The simulator may be a separate facility using a model of an actual security system, or the simulator may be run on an actual security system having a command and control center with a computer programmed with various breach scenarios.

Personnel may be trained or proficiency tests may be performed using the method according to the invention. A security system and the security area are modeled according to the flow of FIG. 2. This portion of the method, or simulator, may be preprogrammed and stored on a facility security system computer that may be part of the facility command and control center or a separate computer. Breach scenarios may be preprogrammed and selected or they may be entered during the simulation. Personnel being trained respond to the breach scenario using countermeasures and/or procedures that would normally be made available in a real breach event. The countermeasures may be entered by the trainee during the simulation or may be selected from the simulator. The simulator then judges the trainee response and provides an output relating to the effectiveness of the response. The simulator may also be programmed to counter the trainee response with one or more additional breach scenarios.

The foregoing description is directed to particular embodiments of the present invention for the purpose of illustration and explanation. It will be apparent, however, to one skilled in the art that many modifications and changes to the embodiment set forth above are possible without departing from the scope of the invention and the following claims.

What is claimed is:

1. A method of designing and testing a security system using computer modeling, comprising:
    selecting one or more security elements of a security system for a security area;
    modeling the security system for the security area using the selected security elements placed at selected locations in the security area;
    selecting a breach scenario;
    executing the breach scenario to test the efficacy of the modeled security system; and
    updating the modeled security system based on results of executing the breach scenario, thereby designing the security system prior to implementing the modeled security system at the security area.

2. The method of claim 1, wherein the one or more security elements include selected sensors having known specifications.

3. The method of claim 1, wherein the one or more security elements include one or more of i) an ultra wideband (UWB) sensor, ii) a closed-circuit TV (CCTV), iii) a microwave sensor, iv) a laser sensor, v) a contact switch, vi) an infrared sensor, vii) a motion sensor, viii) a heat detector, ix) a smoke detector, x) a pressure sensor, xi) an accelerometer, and xii) a vibration sensor.

4. The method of claim 1, wherein the one or more security elements include selected personnel.

5. The method of claim 1, wherein the one or more security elements include a response procedure.

6. The method of claim 1, wherein the security area includes one or more structures including at least one of i) a man-made structure and ii) a natural structure.

7. The method of claim 1, wherein the security area includes facilities that support the security area.

8. The method of claim 1, wherein the security area comprises grounds including one or more of i) grounds within a defined perimeter and ii) grounds outside a defined perimeter.

9. The method of claim 1 further comprising modeling a command and control center for the modeled security system.

10. The method of claim 1, wherein testing the security system model comprises implementing a computer simulation that utilizes an attack scenario as part of the breach scenario.

11. The method of claim 1 further comprising using the test to determine a weakness in the modeled security system.

12. The method of claim 11 further comprising updating the security system based at least in part on the determined weakness.

13. The method of claim 1, wherein the security system model is a model of an existing security system.

14. The method of claim 1, wherein the testing is performed at least in part remotely using at least two computers connected by one of i) a LAN, ii) a WAN, iii) an intranet, and iv) an Internet.

15. The method of claim 10, wherein the attack scenario is computer generated.

16. The method of claim 1, wherein the breach scenarios are selected from a database of predetermined breach scenarios.

17. The method of claim 1 further comprising selecting one or more parameters to promote realism in the test.

18. The method of claim 17, wherein the one or more parameters are selected from i) temperature, ii) wind, iii) precipitation, iv) fog, v) natural vibration, vi) machine vibration, vii) high water, and viii) ice.

19. A computer-readable medium with instructions recorded thereon for modeling and testing a security system using a computer, the instructions comprising:
    selecting one or more security elements of a security system for a security area;
    modeling the security area using the selected security elements placed at selected locations in locations in the security area;
    selecting a breach scenario; and
    executing the breach scenario to test efficacy of the modeled security area;
    updating the modeled security area based on results of executing the breach scenario prior to implementing the modeled security system at the security area; and
    recording the updated modeled security system in a storage medium.

* * * * *

UNITED STATES PATENT AND TRADEMARK OFFICE
CERTIFICATE OF CORRECTION

PATENT NO. : 7,308,394 B2
APPLICATION NO. : 11/112437
DATED : December 11, 2007
INVENTOR(S) : Johnson Page 1 of 1

It is certified that error appears in the above-identified patent and that said Letters Patent is hereby corrected as shown below:

Column 6, line 62, please delete the word "out" and insert --output--;

Column 10, line 21, please delete the word "scenarios" and insert --scenario--;

Column 10, line 22, please delete the word "are" and insert --is--;

Column 10, line 36, please delete "in locations";

Column 10, line 38, please delete the word "and".

Signed and Sealed this

Twentieth Day of May, 2008

JON W. DUDAS
*Director of the United States Patent and Trademark Office*